(12) United States Patent
Rezzi et al.

(10) Patent No.: US 7,888,973 B1
(45) Date of Patent: Feb. 15, 2011

(54) MATRIX TIME-TO-DIGITAL CONVERSION FREQUENCY SYNTHESIZER

(75) Inventors: Francesco Rezzi, Cava Manara (IT); Antonio Liscidini, Pavia (IT)

(73) Assignee: Marvell International Ltd., Hamilton (BM)

( * ) Notice: Subject to any disclaimer, the term of this patent is extended or adjusted under 35 U.S.C. 154(b) by 230 days.

(21) Appl. No.: 12/133,119

(22) Filed: Jun. 4, 2008

Related U.S. Application Data (60) Provisional application No. 60/942,036, filed on Jun. 5, 2007, provisional application No. 60/949,123, filed on Jul. 11, 2007.

(51) Int. Cl.
*H03B 21/00* (2006.01)
(52) U.S. Cl. ..................................... 327/105
(58) Field of Classification Search .................. 327/105
See application file for complete search history.

(56) References Cited

U.S. PATENT DOCUMENTS

| | | | |
|---|---|---|---|
| 5,796,682 A * | 8/1998 | Swapp | 368/120 |
| 6,628,276 B1 * | 9/2003 | Elliott | 345/213 |
| 6,826,247 B1 * | 11/2004 | Elliott et al. | 375/376 |
| 7,205,924 B2 * | 4/2007 | Vemulapalli et al. | 341/166 |
| 7,501,973 B2 * | 3/2009 | Choi et al. | 341/166 |
| 7,522,084 B2 * | 4/2009 | Huang et al. | 341/157 |
| 2009/0028274 A1 * | 1/2009 | Kim et al. | 375/340 |

OTHER PUBLICATIONS

Staszewski et al., "1.3 V 20 ps Time-to-Digital Converter for Frequency Synthesis in 90-nm CMOS," *IEEE Transactions on Circuits and Systems—II: Express Briefs*, vol. 53, No. 3, Mar. 2006; pp. 220-224.

Tonietto et al., "A 3M Hz Bandwidth Low Noise RF All Digital PLL with 12ps Resolution Time to Digital Converter" *IEEE*, 2006, pp. 150-153.

Dudek et al., "A High-Resolution CMOS Time-to-Digital Conveter Utilizing a Vernier Delay Line," *IEEE Transactions on Solid-State Circuits*, vol. 35, No. 2, Feb. 2000, pp. 240-247.

* cited by examiner

*Primary Examiner*—Lincoln Donovan
*Assistant Examiner*—William Hernandez (57) ABSTRACT

The present disclosure provides for a time to digital converter (TDC). The time to digital converter can include a reference ingress that receives a reference signal and passes the reference signal through multiple delay elements, a clock signal ingress that receives a clock signal and passes the clock signal through another set of delay elements, and multiple comparators, which are fewer in number than the total number of delay elements. The multiple comparators 1) receive the delayed reference and delayed clock signals and 2) output a set of comparison results for comparisons of pairs of delayed references and delayed clock signals.

37 Claims, 11 Drawing Sheets

MATRIX TIME-TO-DIGITAL CONVERSION FREQUENCY SYNTHESIZER

INCORPORATION BY REFERENCE

This application claims the benefit of U.S. Provisional Applications No. 60/942,036, "Digital Fractional Synthesizer with Matrix TDC" filed on Jun. 5, 2007, and No. 60/949,123, "Matrix Vernier Time to Digital Converter" filed on Jul. 11, 2007, which are incorporated herein by reference in their entirety.

BACKGROUND

Vernier measurement techniques can improve the resolution of an instrument that makes a coarse measurement with a main scale. Generally, a Vernier scale has an integer number of divisions, D, that span the same length or arc as D−1 divisions of the main scale. The Vernier scale can be read by locating the best-aligned division mark on the Vernier scale that aligns with any mark on the main scale. The best-aligned Vernier scale mark augments the main scale measurement with a high-resolution length or arc increment.

The Vernier scale can increase the resolution of the instrument because the numbers of divisions of the two scales are coprime integers. For example, D is coprime to D−1 for any integer D greater than one. The resolution of an instrument equipped with a Vernier scale that has D divisions that span the same length or arc as D−1 main scale divisions can be D times better than one division of the main scale. The number of main scale or Vernier scale divisions required to achieve a high-resolution may be large.

Vernier techniques may be applied to time difference measurement problems by using delay elements to determine time divisions. For example, Vernier techniques may be used to measure the difference in the time of arrival or phase of two electronic signals. The delay elements may have a minimum manufacturable delay value that can preclude direct high-resolution measurements of time differences. The number of delay elements needed to achieve high-resolution time difference measurements may be large. The uncertainty in the measured time difference can increase with the number of delay elements, thus affecting devices that are sensitive to time or phase measurement errors.

SUMMARY

The present disclosure provides for a time to digital converter (TDC). The time to digital converter can include a reference ingress that receives a reference signal and passes the reference signal through multiple delay elements, a clock signal ingress that receives a clock signal and passes the clock signal through another set of delay elements, and multiple comparators, which are fewer in number than the total number of delay elements. The multiple comparator 1) receive the delayed reference and delayed clock signals and 2) output a set of comparison results for comparisons of pairs of delayed references and delayed clock signals.

The present disclosure can enable a method of digitizing a time difference that includes delaying a reference signal in multiple first delay elements, delaying a clock signal in multiple second delay elements, and comparing pairs of delayed reference and clock signals in multiple comparators, where the number of comparators exceeds the number of first and second delay elements.

The disclosure can provide for a TDC that includes a delay line that receives a reference signal, another delay line that receives a clock signal, and a matrix memory. The delay lines can delay the reference and the clock signals by multiple units of delay. The time unit by which the clock signal is delayed can differ from the time unit by which the reference signal is delayed. The matrix memory can store the multiply-delayed reference signals at sampling instants of the multiply-delayed clock signals. The matrix memory can encode the time delay difference between the reference signal and the clock signal based on the stored multiply-delayed reference signals.

The disclosure can provide for a frequency synthesizer that can include a TDC that has a delay line that receives a reference signal and delays the reference signal by multiples of a delay unit, a second delay line that receives a clock signal, a matrix memory, a digital filter, a digitally controlled oscillator, a divider, and a controller. The second delay line can delay the clock signal by multiples of a second delay unit that differs from the first delay unit. The two delay lines can delay the reference and clock signals by a total delay that equals the clock period.

The matrix memory can store the set of delayed reference signals at multiple sampling instants given by the multiple delayed clock signals. The matrix memory can encode a time delay difference between the reference signal and the clock signal based on the stored, delayed reference signals. The digital filter can shape the spectrum of the encoded time delay difference to generate a digital control word that can drive a digitally controlled oscillator to generate an oscillatory output signal. The divider can multiply the period of the oscillatory output signal by an integer to generate the clock signal. The controller can adjust the integer multiple used by the divider based on a predetermined ratio between the clock signal period and the output signal period.

The disclosure can provide for a frequency locked loop that can include an input adder, a digital filter, a digitally controlled oscillator, a TDC, and a digital differentiator. The input adder can generate a frequency error word by subtracting a feedback word from a frequency control word. The digital filter can shape the spectrum of the frequency error word. The digitally controlled oscillator can generate an oscillatory output signal that has a frequency that is based on the filtered frequency error word.

The frequency locked loop can couple the digitally controlled oscillator to a TDC that digitizes the time difference between the oscillatory output signal and a reference signal. The TDC can include a delay line that delays the reference signal by multiple delay increments, another delay line that delays a clock signal by multiple delay units. The delay increments of the two delay lines can differ and can delay the reference and clock signals by a total delay equal the period of the clock signal.

The matrix memory can store the multiplicity of delayed reference signals at multiple instants. Each instant can correspond to a particular delayed clock signal. The matrix memory can encode the time delay difference between the reference signal and the clock signal based on the entire stored set of delayed reference signals. The digital differentiator can differentiate the time difference to generate the feedback word that can close the frequency locked loop.

The present disclosure can provide a method for generating a clock signal that can include 1) delaying a reference signal by a set of delays such that the total delay equals a clock period, 2) delaying a clock signal another set of delays that differ from the first set, the second set of delays delaying the clock signal by a total delay equal to the clock period, 3) storing the set of delayed reference signals at multiple times, each storage time given by each delayed clock signals, and 4)

encoding the stored sets to determine the time delay difference between the reference signal and the clock signal.

BRIEF DESCRIPTION OF THE DRAWINGS

The disclosure will make reference to the accompanying figures, wherein like numerals represent like elements, and wherein.

DETAILED DESCRIPTION OF EMBODIMENTS

Figure 1:
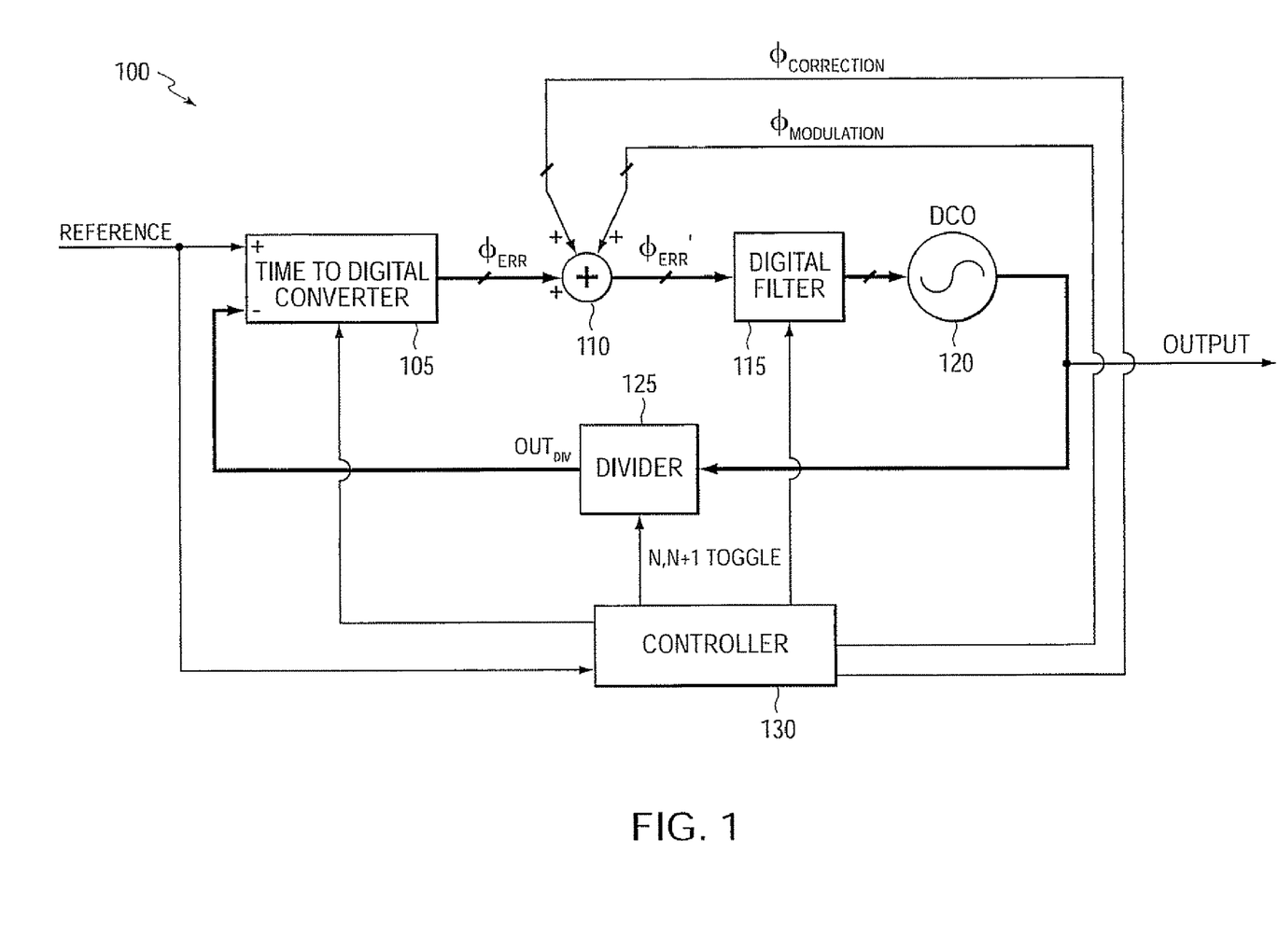
FIG. 1 shows an example of an all-digital phase lock loop (ADPLL)

FIG. 1 shows an example of an all-digital phase lock loop (ADPLL) 100 that can include a time to digital converter (TDC) 105, a digital adder 110, a digital filter 115, a digitally controlled oscillator (DCO) 120, a feedback divider 125, and a controller 130. The ADPLL 100 can generate an oscillatory output signal, denoted OUTPUT, at a desired frequency in response to a reference signal from an external source (not shown). The ADPLL 100 may be described as a phase locked loop in which a time difference (TD) between the reference signal and a frequency-divided feedback signal, $OUT_{DIV}$, generates a timing phase. The $OUT_{DIV}$ signal may be described as a clock signal that has an adjustable clock period. The ADPLL 100 may be described as a frequency synthesizer that can generate a DCO 120 frequency that equal is a multiple of the reference signal frequency. The multiple may be an integer such as one, two or more, or a non-integer value that can be determined by the controller 130, such as 3/2, 7/2, 11/31, and the like.

The TDC 105 can receive the reference signal from the external source and a frequency-divided feedback signal from the feedback divider 125. The TDC 105 can couple a timing error word to the digital adder 110.

The digital adder 110 can receive a timing phase correction and a timing phase modulation digital word from the controller 130 and can couple a modified timing error word to the digital filter 115. The modified timing error word can equal the sum of the timing error, phase correction, and phase modulation digital words.

The digital filter 115 can filter the modified timing error words and can couple filtered timing words to the DCO 120. The DCO 120 can couple the oscillatory output signal to external devices (not shown) and the feedback divider 125.

The controller 130 can receive the reference signal and can generate a toggle control signal to adjust the frequency division factor of feedback divider 125. The controller 130 can also couple control lines to the TDC 105 and the digital filter 115. The controller 130 may couple the phase correction word and the phase modulation word to the digital adder 110 via separate lines or via a single line. The controller 130 can set the proper oscillation frequency by a determining sequence of N/N+1 divisions stored in the controller 130. The divider 125 can receive the DCO 120 output signal and a toggle signal from the controller 130. The divider 125 can couple the frequency-divider feedback signal to the TDC 105.

The TDC 105 can generate the phase error word ($\Phi_{ERR}$) in response to a time difference (TD) between the reference and $OUT_{DIV}$ clock signal. The TDC 105 can produce a $\Phi_{ERR}$ that increases linearly with TD over a range of time differences called the dynamic range (DR). The DR may be close to the period of the DCO 120 oscillatory output signal. An embodiment of the TDC 105 may operate with low power consumption and latency due to a reduction in the number of internal delay elements compared with the number of memory elements disclosed in FIG. 7 and FIG. 8.

After receiving the phase correction and modulation words from the controller 130, the digital adder 110 can add the phase correction and modulation words to the timing error word. The phase modulation word can dither or modulate the DCO 120 output. For example, the phase modulation word can frequency-modulate the DCO 120 output. The phase correction word can suppress spurs or side lobes in the output signal that can occur when the feedback divider 125 toggles between a division factor of N and N+1 to generate an output frequency that is a non-integer multiple of the reference signal frequency.

The digital filter 115 can shape the time domain or frequency domain characteristics of the modified timing error word from digital adder 110. For example, digital filter 115 can low-pass filter the modified timing error word. The digital filter 115 can, in conjunction with the loop gain provided by the DCO 120, the feedback divider 125, the TDC 105, and the digital adder 110, determine the impulse response or step response of the ADPLL 100. For example, the digital filter 115 may impose a critically damped loop characteristic on the ADPLL 100. A critically damp loop can exhibit a loop damping factor of approximately 0.7.

The DCO 120 can oscillate in accordance with a digitally filtered word from digital filter 115. For example, the frequency of oscillation of DCO 120 may be proportional to the digitally filtered word from digital filter 115. The DCO 120 output may oscillate at a frequency that is an integer or non-integer multiple of the reference signal frequency. The DCO 120 output frequency may be determined by the average division factor of the divider 125.

The controller 130 may, upon receiving the reference signal, adjust the division factor of the feedback divider 125. For example, the controller 130 may toggle the feedback division factor between two integer values of N and N+1. The controller 130 may modify the toggle rate and toggle signal phase, with respect to the reference signal, to fine-tune the frequency of DCO 120. In other words, the ADPLL 100 may operate as a frequency synthesizer that generates a DCO 120 signal that has a frequency that is equal to or higher than the reference signal frequency.

The controller 130 may supply the phase correction and modulation words to the digital adder 110. The phase correction word may suppress spurs or side lobes that may be introduced by toggling the feedback divider 125 between N and N+1.

The controller 130 may issue configuration control signals to the TDC 105, the digital filter 115, and the feedback divider 125. For example, the controller 130 may adjust the loop filter characteristics by modifying a cutoff frequency or a damping factor of the digital filter 115. The controller 130 may calibrate the TDC 105, adjust the absolute or relative delays of resolution elements within TDC 105, establish a linear or dynamic range for TDC 105, and modify the power consumption of TDC 105. For example, the controller 130 may couple the reference signal to both a first and second delay line in the TDC 105 during calibration. The controller 130 may supply an overall delay word to the TDC 105 and may control the DAC 970 and digital filter 960 discussed with respect to FIG. 9.

Controller 130 may initialize an encoder in TDC 105 that encodes a matrix of paired bit comparisons to form a phase error word. For example, the encoder may convert a matrix of comparisons into a digital error word, $\Phi_{ERR}$. The encoder may be a lookup memory, such as a read-only memory (ROM), a gate-array, a programmable logic array (PLA), and the like.

Figure 2:
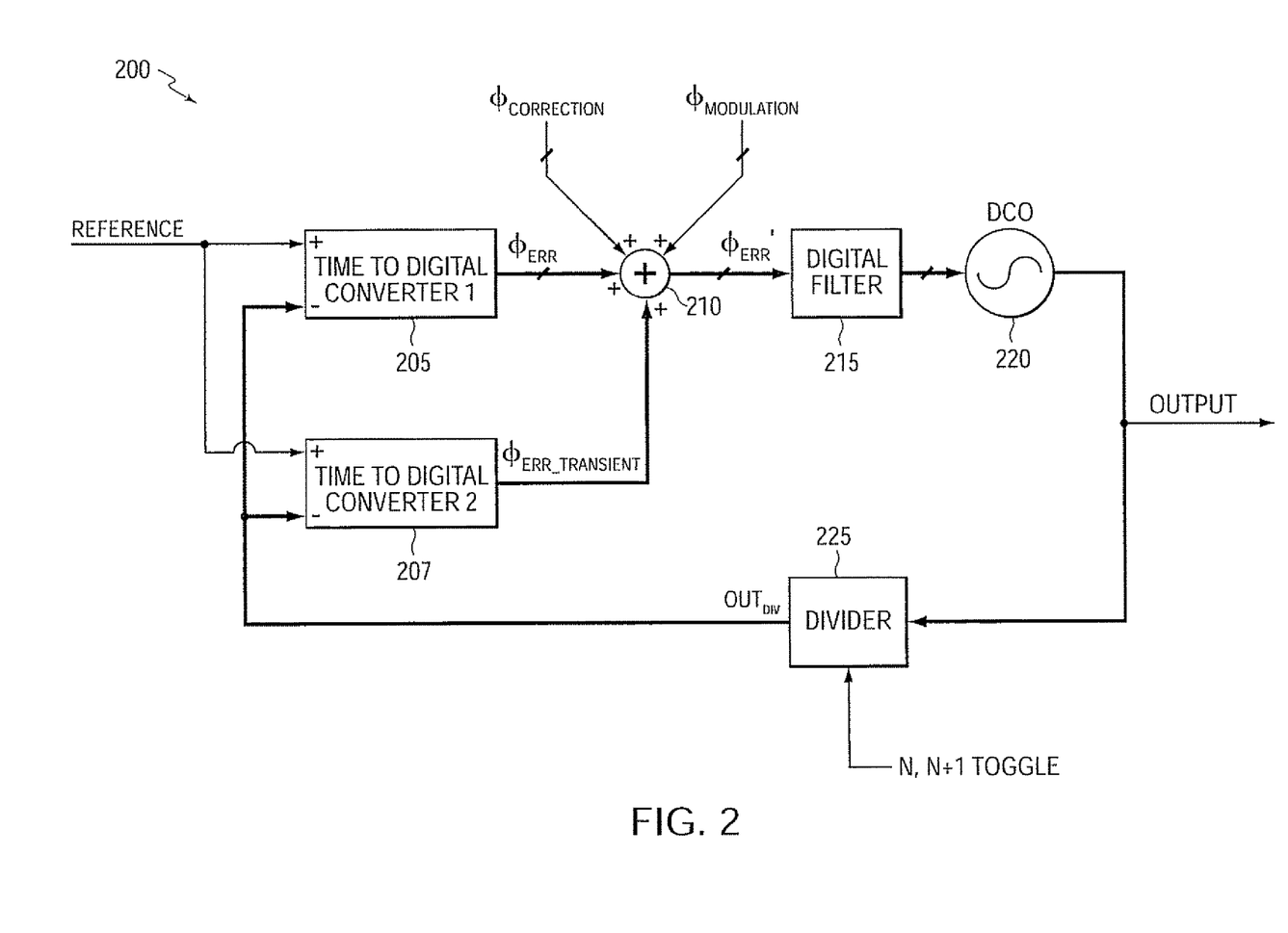
FIG. 2 shows an example of a dual-detector ADPLL.

FIG. 2 shows an example of a dual-detector ADPLL 200 that can include a first TDC 205, a second TDC 207, a digital adder 210, a digital filter 215, a DCO 220, and a feedback divider 225. The elements of ADPLL 200 can correspond to similarly numbered elements of ADPLL 100. The elements of ADPLL 200 may be controlled by a controller, such as controller 130, as disclosed with respect to FIG. 1.

The second TDC 207 can receive the reference signal and the divided feedback signal, $OUT_{DIV}$, which may also be described as a clock signal, from the feedback divider 225. The second TDC 207 and can generate a phase transient signal, $\Phi_{ERR\_TRANSIENT}$, that can be added to the phase error signal or digital error word, $\Phi_{ERR}$, from the first TDC 205 at the digital adder 210. The second TDC 207 may exhibit a wider dynamic range or linear range and larger TD steps than the first TDC 205. In other words, the second TDC 207 may have a coarse resolution so that a wide range of time differences (TDs) or phase errors can be quantized with a linear relationship between the phase of the reference signal and the $OUT_{DIV}$ clock signal.

The second TDC 207 may accelerate the locking characteristics of ADPLL 200 upon start-up. The second TDC 207 may, for example, improve the acquisition time, settling time, lock-in range, and the like, of ADPLL 200. A controller (not shown) may disable the second TDC 207 after the DCO 220 output signal is phase-locked to the reference signal. In other words, the second TDC 207, a controller, and the first TDC 205, may implement a two-mode phase tracker, with a coarse mode followed by a fine mode.

Figure 3:
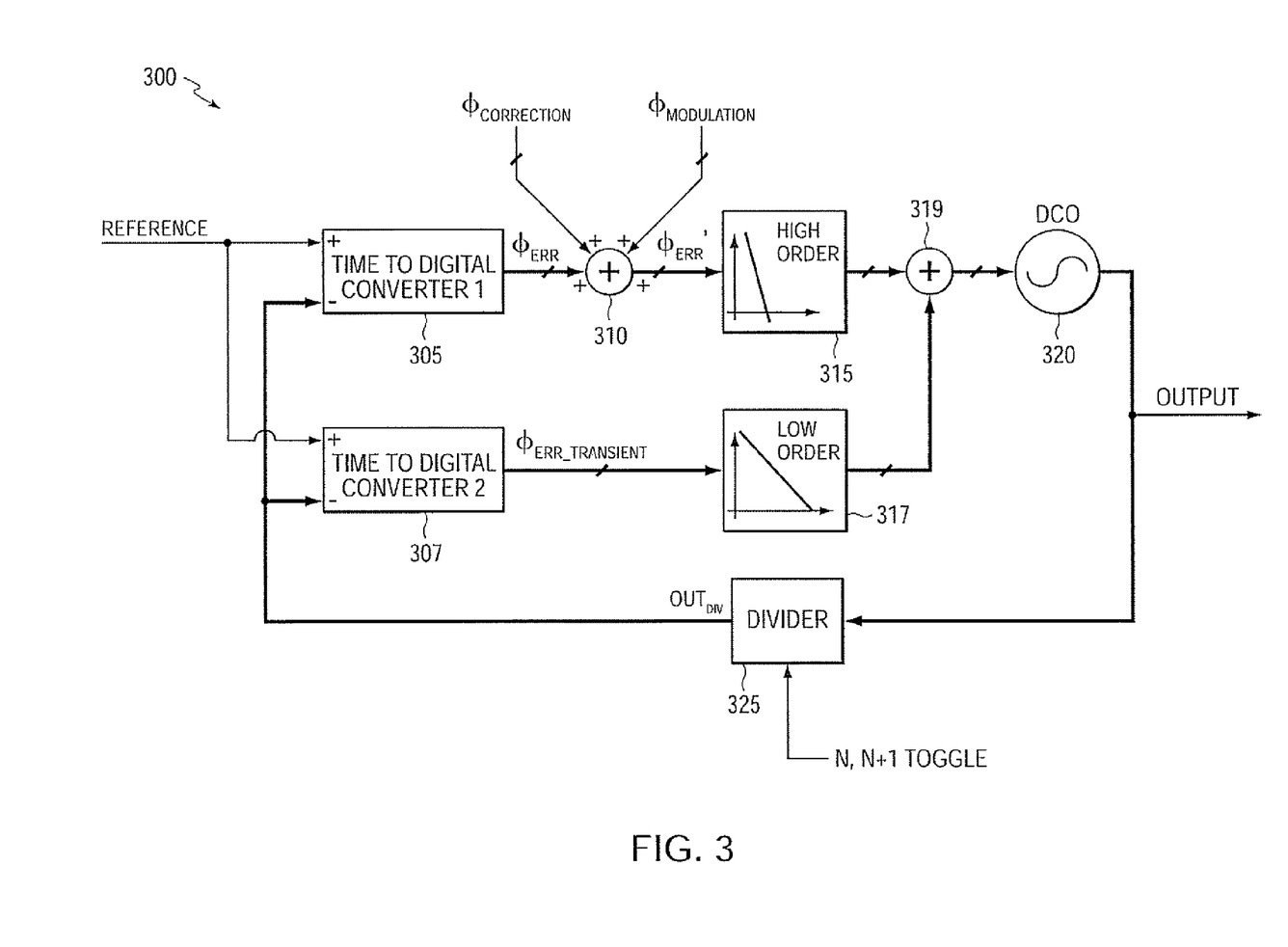
FIG. 3 shows an example of a multiply quantized (MQ) ADPLL.

FIG. 3 shows an example of a multiply quantized (MQ) ADPLL 300 that can include a first TDC 305, a second TDC 307, a first digital adder 310, a first digital filter 315, a second digital filter 317, a second digital adder 319, a DCO 320, and a feedback divider 325. Similarly numbered elements of MQ ADPLL 300 and correspondingly numbered elements of dual-detector ADPLL 200 and ADPLL 100 may have corresponding functions and interconnections.

The first digital filter 315 and the second digital filter 317 may process finely resolved ($\Phi_{ERR}$) and coarsely resolved ($\Phi_{ERR\_TRANSIENT}$) phase error signals from the first TDC 305 and the second TDC 307, respectively. The frequency-shaping or spectral characteristics of first digital filter 315 and second digital filter 317 may be different. For example, the first digital filter 315 may exhibit a fast roll-off with respect to frequency that reduces phase noise components for frequencies above the loop bandwidth of MQ ADPLL 300. In other words, the characteristics of first digital filter 315 may be selected to optimize the phase tracking behavior of MQ ADPLL 300.

The second digital filter 317 may exhibit a slow frequency roll-off, when compared to the first digital filter 315, and may improve the transient response of the MQ ADPLL 300 relative to that of the ADPLL 100 or ADPLL 200. For example, the rate of roll-off and the cut-off frequency of the second digital filter 317 may reduce the acquisition time of the reference signal relative to an ADPLL that uses a single TDC and digital filter.

The first TDC 305 and the second TDC 307 may generate a first, finely resolved and a second, coarsely resolved timing error signal from the reference signal and the feedback divider 325 signal. Each timing error signal or time difference (TD) can include quantization noise that can perturb the MQ ADPLL 300 phase tracking behavior. The first digital filter 315 can shape the phase noise spectrum and can reduce the phase jitter in the DCO 320 signal while tracking. Jitter can be described as a momentary error in the synchronism of two coherent signals. The second digital filter 317 can allow the MQ ADPLL 300 to capture the reference signal phase or timing rapidly upon start-up.

A controller (not shown), can disable the second TDC 307 after the MQ ADPLL 300 acquires the reference signal frequency and timing phase. As with ADPLL 200 and ADPLL 100, the controller may toggle the division factor of feedback divider 325 to fine-tune the frequency of DCO 320 so that the MQ ADPLL 300 can implement a frequency synthesizer. In other words, the average frequency of the MQ ADPLL 300 output can equal the reference signal frequency multiplied by factor between N and N+1. From another perspective, the average period of the reference signal can equal the average period of the MQ ADPLL 300 output multiplied by a factor between N and N+1.

Figure 4:
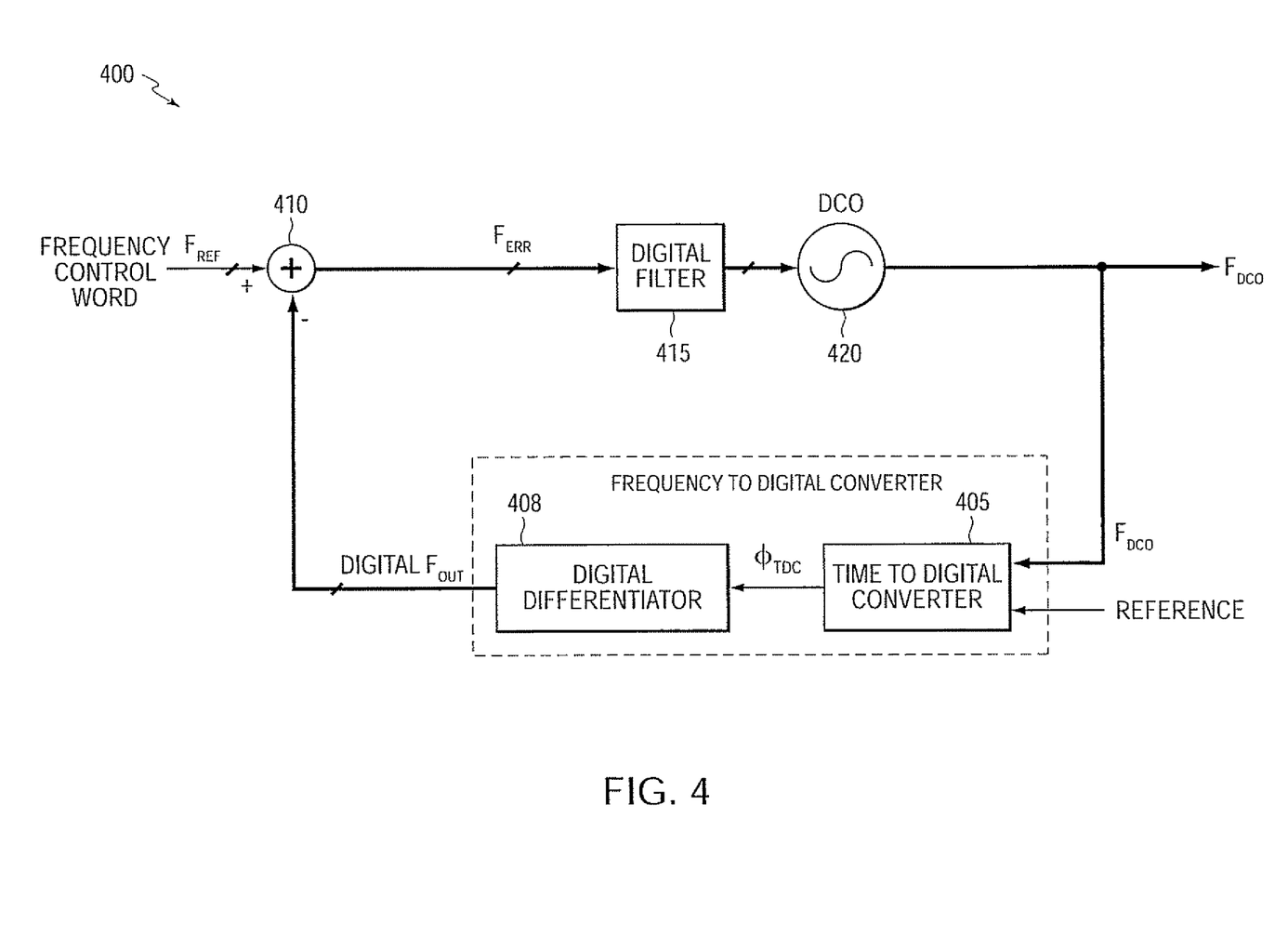
FIG. 4 shows an example of an all-digital frequency lock loop (ADFLL)

FIG. 4 shows an example of an all-digital frequency lock loop (ADFLL) 400 that can include a TDC 405, a digital differentiator 408, a digital adder 410, a digital filter 415, and a DCO 420. The structure and behavior of the elements of ADFLL 400 that correspond to elements of ADPLL 100, ADPLL 200, or ADPLL 300, are to be understood to exhibit similar behavior. A controller (not shown) may be understood to control all elements of ADFLL 400.

The digital adder 410 can receive a frequency control word, $F_{REF}$, which can determine the frequency of oscillation of DCO 420. The digital adder 410 can generate a frequency error word, $F_{ERR}$, which is filtered by the digital filter 415. The digital filter 415 can generate a control word to the DCO 420 that determines the frequency of oscillation, $F_{DCO}$, of the output of ADFLL 400. The DCO 420 output can couple a clock signal to a first input of the TDC 405. The TDC 405 can compare the timing of the DCO 420 clock signal to a reference signal that is received on a second input to the TDC 405. The phase error or TD between the $F_{DCO}$ and reference signals may be quantized by TDC 405 and supplied to the digital differentiator 408.

The digital differential 408 may differentiate the output of the TDC 405, $\phi_{TDC}$, to form a digital frequency word, $F_{out}$. The digital differentiator 408 may implement a first-order backward difference, an approximate differentiator designed via the bilinear transformation, a low-pass differentiator, and the like. Taken together, the TDC 405 and the digital differentiator 408 may be considered to be a frequency-to-digital converter (FDC) element.

Figure 5:
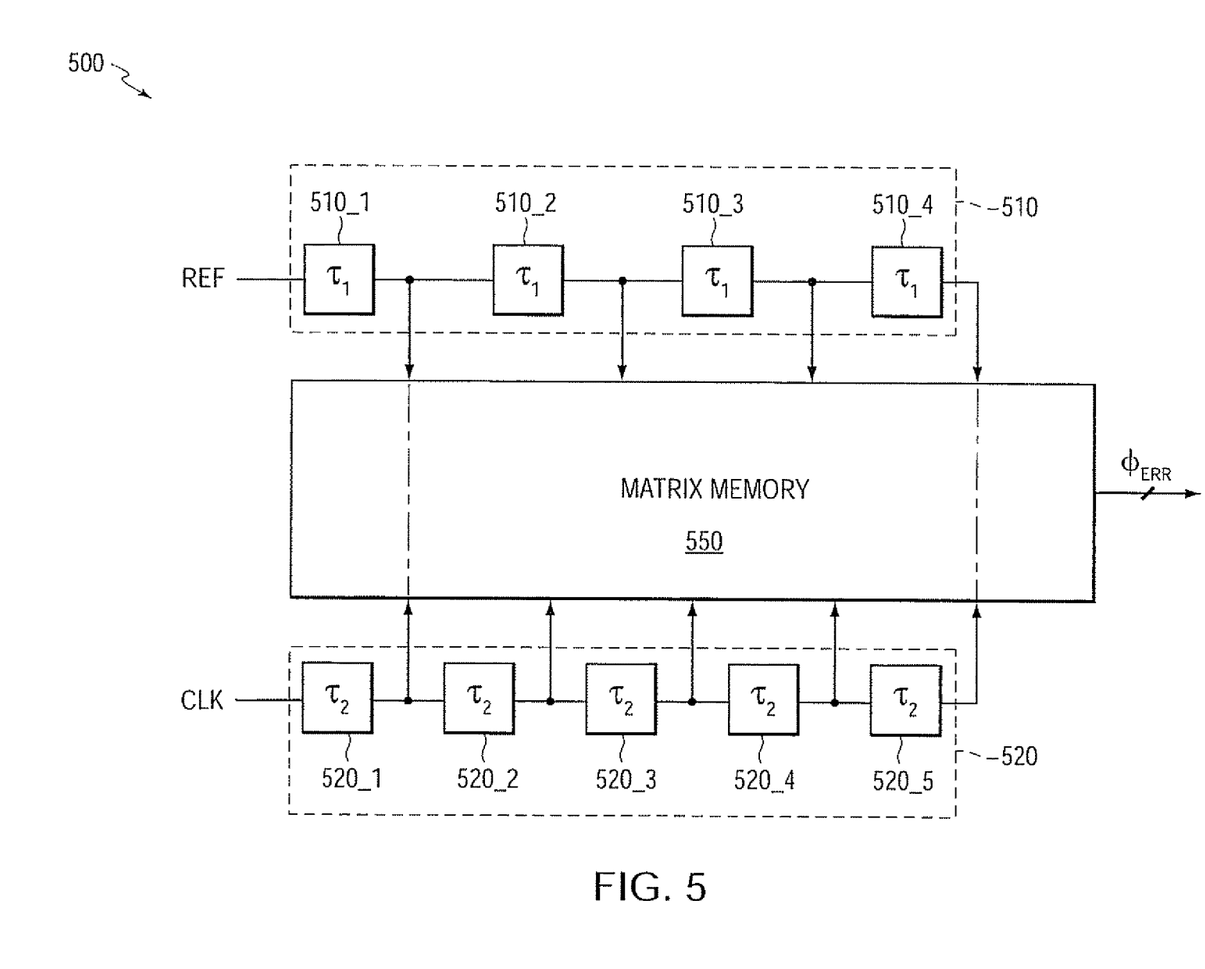
FIG. 5 shows an example of a matrix Vernier time to digital converter (TDC)

FIG. 5 shows an example of a matrix Vernier TDC 500 that can include a first delay line 510, a second delay line 520, and a matrix memory 550. The first delay line 510 may include a series of delay elements 510_1 to 510_4 while the second delay line 520 may include a series of delay elements 520_1 to 520_5. The first delay line 510 can receive a reference signal, REF, such as the reference signal that is supplied to ADPLL 100, and can delay the REF signal by a series of approximately equal delays, $\tau_1$, in delay element 510_1 to 510_4. The REF signal may be coupled to the matrix memory 550 and to the first delay element, 510-1. The output of each delay element 510_1 to 510_4 may also be coupled to the matrix memory 550.

The clock signal, CLK, may be supplied to the matrix memory 550 and to the delay element 520_1. The CLK signal may correspond to the $OUT_{DIV}$ disclosed with respect to ADPLL 100, dual-detector ADPLL 200, MQ ADPLL 300, and the $F_{DCO}$ signal disclosed with respect to ADFLL 400. Each delay element 520_1 to 520_5 may have an approximately equal delay, $\tau_2$.

The output of delay element 510_4 and delay element 520_5 may be calibrated so that the total delays through the first delay line 510 and the second delay line 520 are substantially equal. For example, the total delays can both equal the period of a DCO clock or a divided DCO clock, such as $OUT_{DIV}$ described with respect to FIGS. 1-3. Each cumulative delay through first delay line 510 and second delay line 520 have been drawn in FIG. 5 so that the distance along the horizontal axis of FIG. 5 may be interpreted as proportional to time. As will be shown with respect to FIG. 9, the matrix memory 550 can store each delay line state and can treat each delay line state as a digital word. In other words, the output of first delay line 510 and delay line 520 may form digital words that can be stored in the matrix memory 550.

The bits in the digital word from first delay line 510 and second delay line 520 can be combined in pairs so that each combination of bits can be stored in the matrix memory 550. For example, as shown, the first delay line 510 can include four delay elements 510_1 to 510_4 while the second delay line 520 can include five delay elements 520_1 to 520_5. The four bit word from the REF signal and the first delay line 510 and the five bit word from the second delay line 520 can form 20 pair-wise bit combinations that can be stored in the matrix memory 550. The matrix memory 550 may include an encoder that encodes the stored bit comparisons to form a digital timing error word, $\phi_{ERR}$.

The performance of TDC 500 can be understood by considering the CLK signal and treating the outputs of each delay elements 520_1 to 520_5 as additional clock signals that store the state of the first delay line 510. In other words, the second delay line 520 may convert the CLK signal to a polyphase clock.

Each delay element of first delay line 510 and second delay line 520 may be adjusted or calibrated by a controller (not shown). In other words, each delay element may be adjusted so that the delay, $\tau_1$ of each element of first delay line 510 and time delay, $\tau_2$, of second delay line 520 are such that the total delay to element 510_4 and 520_5 are equal.

The matrix memory 550 can include clocked memory elements, such as flip-flops, set-reset flip-flops, latches, and the like. Matrix memory 550 can include an encoder, such as a programmable encoder, a read only memory (ROM) that encodes the states of pairs of bits from the first and second delay lines 510 and 520, a gate array, a programmable logic array, and the like. The matrix memory 550 can produce multi-bit output word, $\phi_{ERR}$. For example, in response to a four bit first delay line word and a five bit second delay line word, the matrix memory 550 can produce a five-bit output word, $\phi_{ERR}$. In other words, the matrix memory 550 may resolve a time difference between the REF signal and the CLK signal to one of twenty states out of the 32 states that can be represented with five bits.

When calibrated, the TDC 500 can implement a time to digital converter with a time resolution unit or delay unit of denoted $\Delta\tau$. The $\Delta\tau$ of TDC 500 can reduce quantization noise relative to the noise from a quantizer that resolves time to $\tau_1$ or $\tau_2$. It may be noted that quantization noise may be converted to phase noise in an ADPLL or a frequency synthesizer.

Figure 6A:
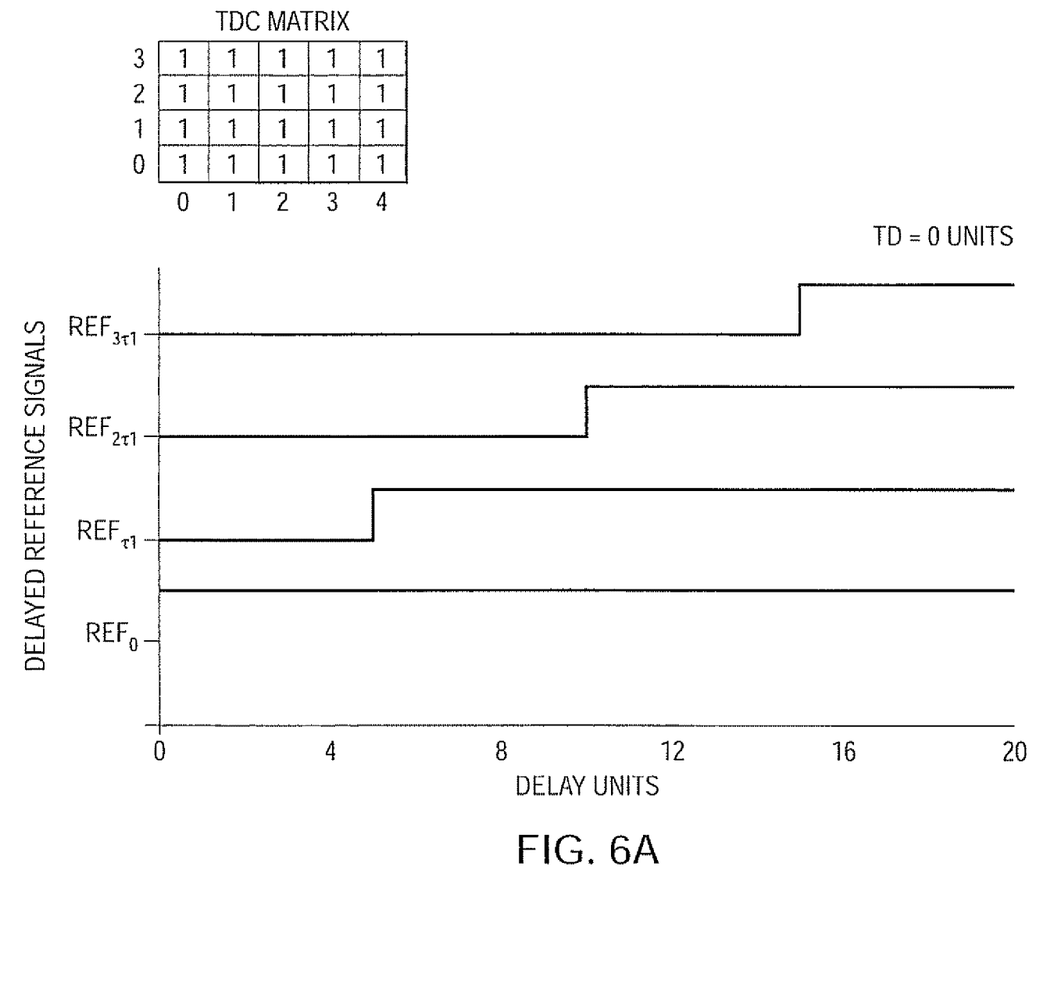
FIG. 6A shows a diagram of an example set of delayed reference signals and a TDC comparison matrix for a matrix Vernier TDC for a reference to clock delay of zero normalized units.

FIG. 6A shows a diagram of an example set of delayed reference signals and a TDC comparison matrix for a matrix Vernier TDC for a reference to clock delay of zero normalized units. The matrix Vernier TDC shown in FIG. 6A can resolve time delay differences to $1/20^{th}$ of the clock period. FIG. 6A can illustrate the time delayed reference waveforms and the TDC comparison matrix bit pair or comparison results that correspond to a zero time difference between a reference and clock signal. For example, the $REF_0$ plot can rise at zero delay units while $REF_{\tau 1}$ can rise after 5 delay units since the first delay elements 510_1 provides a delay of $5/20^{th}$ of a clock period. In other words, the multiply-delayed REF signal can be the sampled output of, for example, the 4 delay elements 510_1 to 510_4 of delay line 510. The multiply-delayed REF signals can be sampled and stored at the multiple sampling instants given by, for example, the rising edges of the delay elements 520_1 to 520_5.

Figure 6B:
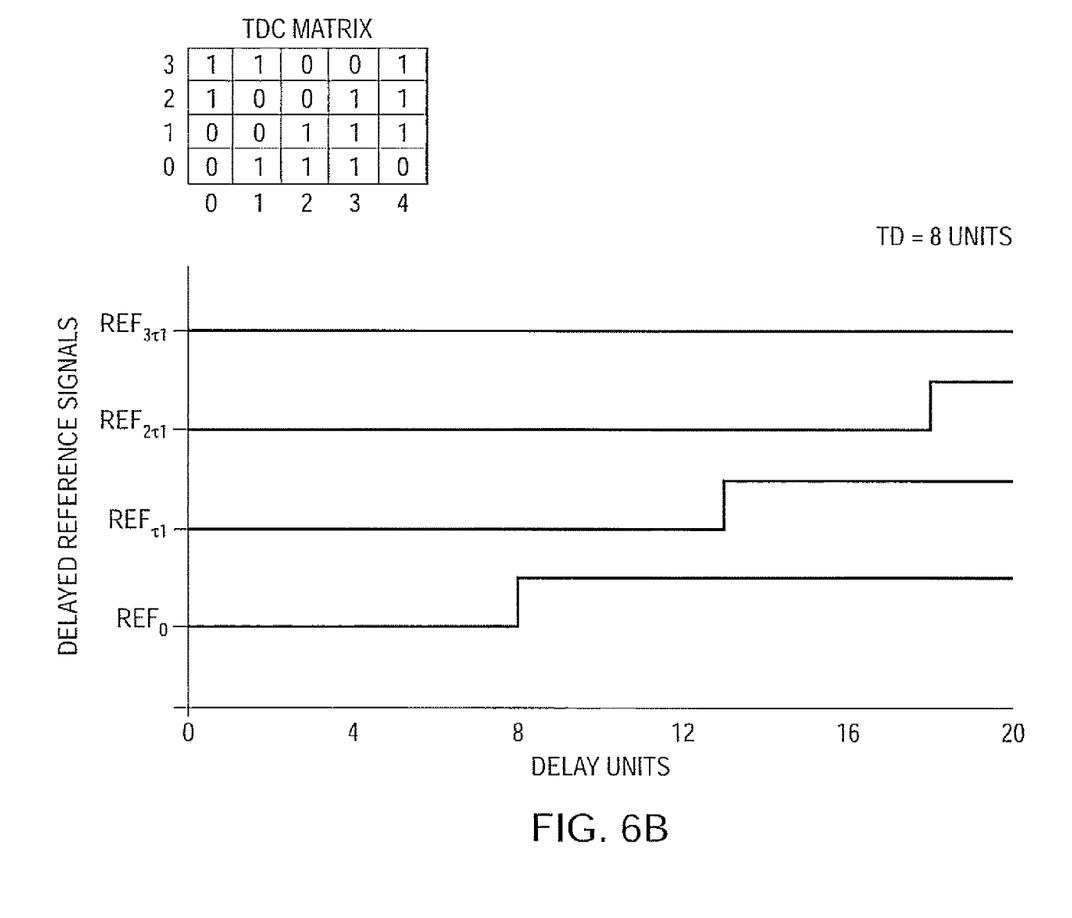
FIG. 6B shows a diagram of an example set of delayed reference signals and a TDC comparison matrix for a matrix Vernier TDC for a reference to clock delay of eight normalized units.

FIG. 6B shows a diagram of an example set of delayed reference signals and a TDC comparison matrix for a matrix Vernier TDC for a reference to clock delay of eight normalized units. For example, the $REF_0$ plot can rise at eight delay units while $REF_{\tau 1}$ can rise after 5 additional delay units since the first delay elements 510_1 provides a delay of $5/20^{th}$ of a clock period.

Figure 6C:
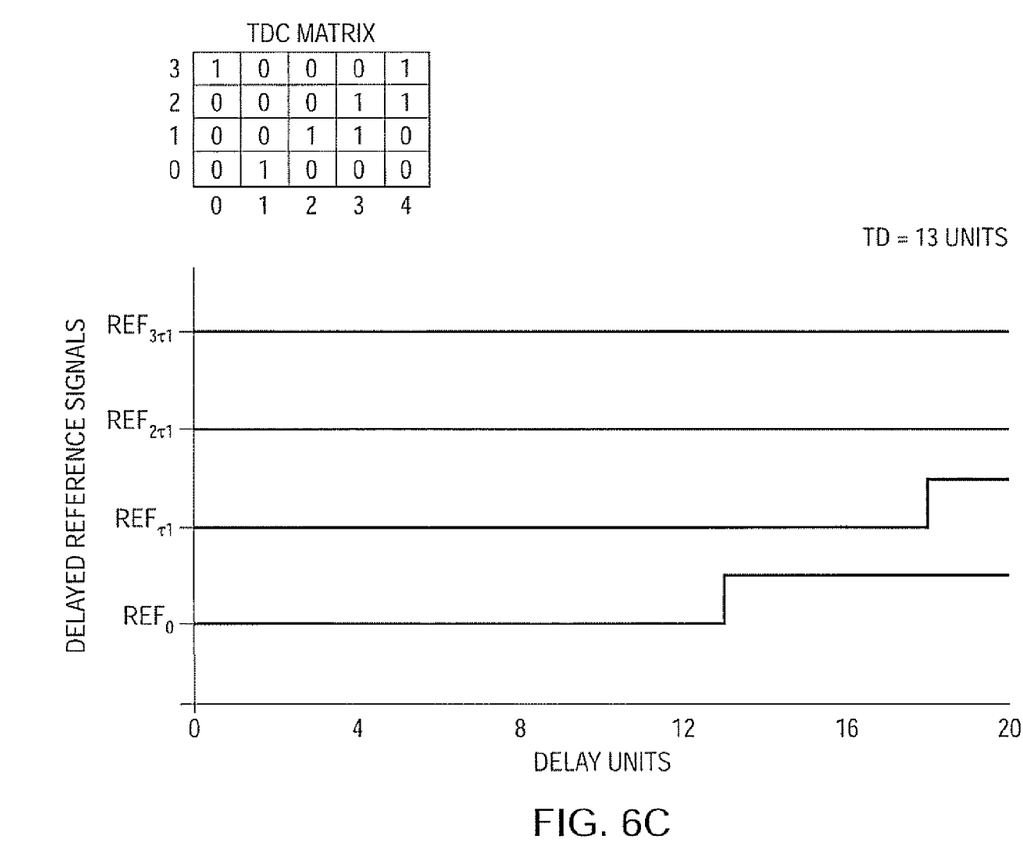
FIG. 6C shows a diagram of an example set of delayed reference signals and a TDC comparison matrix for a matrix Vernier TDC for a reference to clock delay of thirteen normalized units.

FIG. 6C shows a diagram of an example set of delayed reference signals and a TDC comparison matrix for a matrix Vernier TDC for a reference to clock delay of thirteen normalized units. For example, the $REF_0$ plot can rise at thirteen delay units while $REF_{\tau 1}$ can rise after 5 additional delay units since the first delay elements 510_1 provides a delay of $5/20^{th}$ of a clock period.

Each of the TDC comparison matrices of FIGS. 6A-C may be interpreted as a matrix of the samples of delayed reference signals at sampling times given by a delayed replicas of the clock signal. In other words, the accumulating skew or time delays of the CLK signal with respect to the delayed REF signals can produce the array of stored comparisons shown in the TDC comparison matrixes of FIGS. 6A-C. The storage and comparison may be implemented simultaneously, for example, by clocking latches, flip-flops, and the like.

To assist in understanding the TDC comparison matrices in FIGS. 6A-C, one can refer to Table 1 below. Table 1 shows, in normalized delay units, an example of the sampling instants of a reference signal due to the combination of delays from the two delay lines in a 20-state TDC. In this example, when the reference signal is delayed by more than the number of units in a given entry of the delay matrix in Table 1, the time difference between the reference signal and the clock signal may be represented by a ONE in a corresponding entry in the TDC comparison matrix of FIGS. 6A-C. The number of delay units can range from zero up to one less than the number of quantization intervals in a TDC. Table 2 shows an example of the sampling instants for a 15-state TDC.

TABLE 1

Normalized Time Resolution Units for a 20-state TDC
1 Unit = $T_{CLK}/(N - M)$, $N_{\tau 1} = M_{\tau 2} = T_{CLK}$ N = 4, M = 5

| | | | | | |
|---|---|---|---|---|---|
| 3 | 15 | 11 | 7  | 3  | 19 |
| 2 | 10 | 6  | 2  | 18 | 14 |
| 1 | 5  | 1  | 17 | 13 | 9  |
| 0 | 0  | 16 | 12 | 8  | 4  |
|   | 0  | 1  | 2  | 3  | 4  |

TABLE 2

Normalized Time Resolution Units for a 20-state TDC
1 Unit = $T_{CLK}/(N - M)$, $N_{\tau 1} = M_{\tau 2} = T_{CLK}$ N = 3, M = 5

| | | | | | |
|---|---|---|---|---|---|
| 2 | 10 | 7  | 4  | 1  | 13 |
| 1 | 5  | 2  | 14 | 11 | 8  |
| 0 | 0  | 12 | 9  | 6  | 3  |
|   | 0  | 1  | 2  | 3  | 4  |

It may be noted that the bit comparison entries in alternate rows of the TDC comparison matrices shown in FIG. 6A-C may be complemented if a delay line, such as the first delay line 510, uses inverters rather than non-inverting delay elements, buffer amplifiers, and the like. For example, the "0" row and the "2" row of the example TDC comparison matrices of FIGS. 6A-C may be complemented if the first delay line uses inverters.

Figure 7:
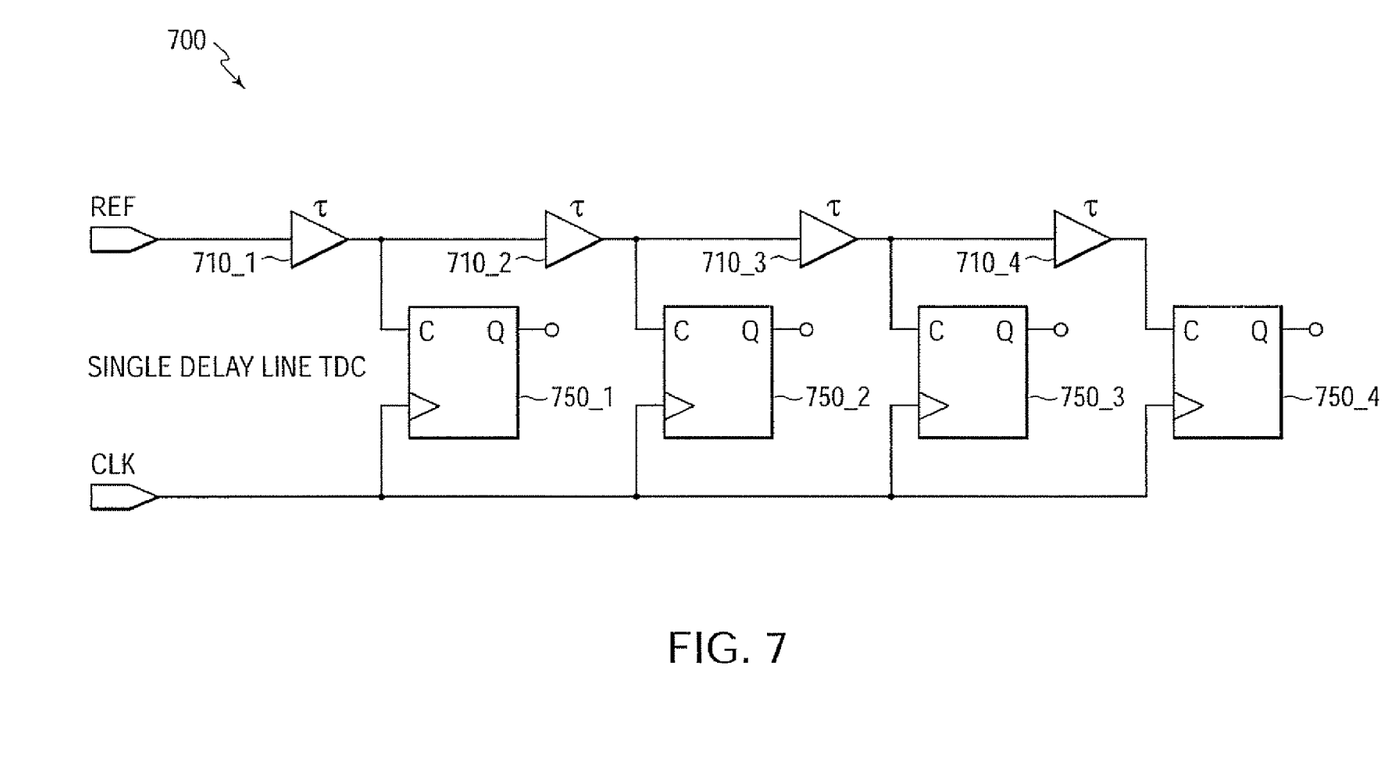
FIG. 7 shows an example of a single delay TDC.

FIG. 7 shows an example of a single delay TDC 700. The single delay line or periodic Vernier TDC 700 can receive the reference signal, REF, on a single delay line 710 that can include approximately equal delay elements 710_1 to 710_4. The single delay line TDC 700 can also include a number of memory elements 750, such as 750_1 to 750_4. There may be an equal number of delay elements 710 as there are memory or storage elements 750. The memory elements 750 can store the state of the delay elements 710 as a thermometric code.

The single delay line TDC 700 can implement a thermometric code memory that is stored at sampling instants given by a common clock signal, CLK, such as a clock signal from a DCO or divider. The common clock can store the state of the single delay line in a memory that can include the same number of memory storage 750 elements as delay elements in the delay line 710. The resolution of single delay line TDC 700 can equal the time delay, τ, of each delay element in the delay line 710. An encoder (not shown) can accept the data output, Q, of each memory element 750 and can encode the thermometric code as a binary output word. The binary output word can represent the time difference between the reference signal and the CLK signal. The total delay that may be represented or measured by the single delay line TDC 700 can equal the product of the delay of a single delay element, τ, times the number of delay elements.

Figure 8:
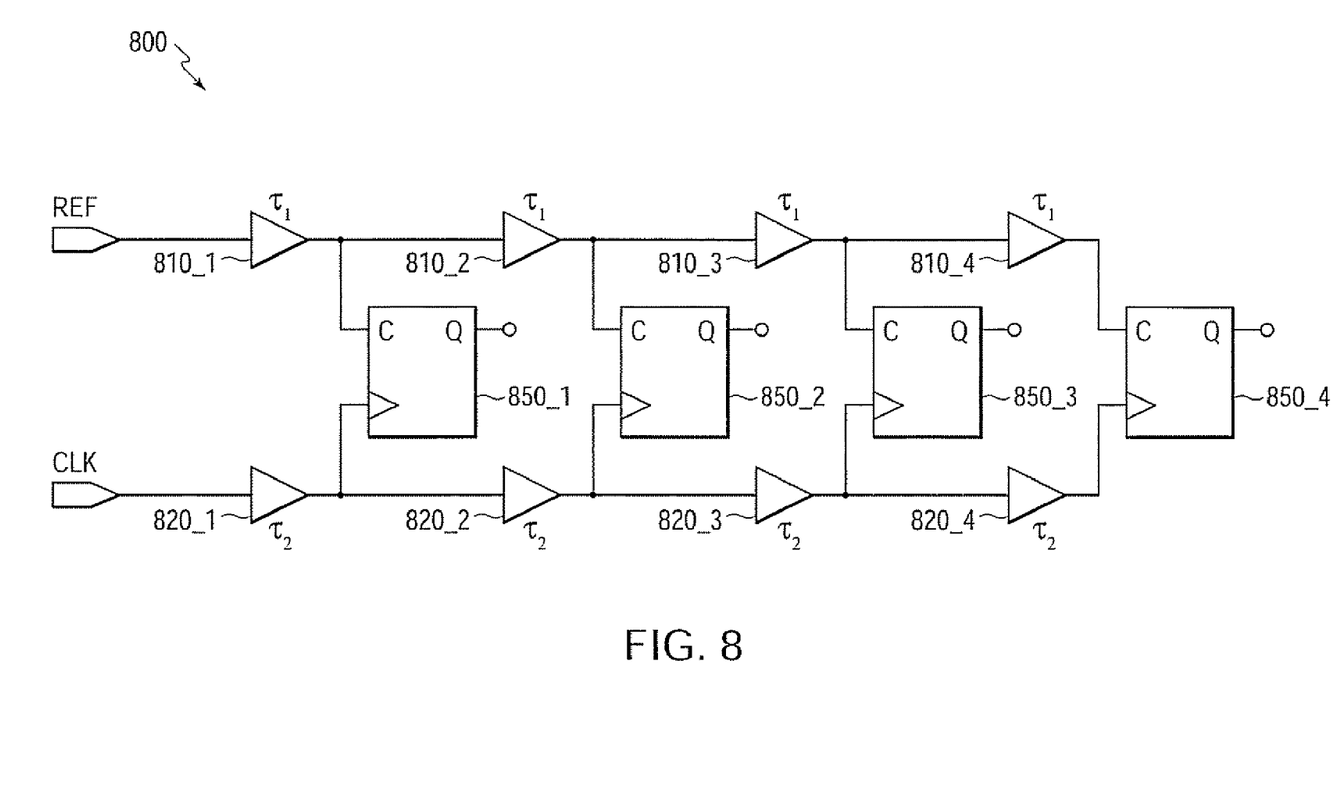
FIG. 8 shows an example of a double delay line TDC.

FIG. 8 shows an example of a double delay line TDC 800. The double delay line TDC 800 can receive a reference signal, REF, on a first delay line 810 and a clock signal, denoted CLK, on a second delay line 820. The double delay line TDC 800 can include a series of memory elements 850_1 through 850_4 that can store the output of each delay element of delay lines 810 and 820. The double delay line TDC 800 can include twice as many delay elements 810 and 820 as memory or storage elements 850. The double delay line TDC 800 can include an encoder (not shown) that can encode the output, Q, of each memory or storage element 850 to form a binary word that quantizes the time delay difference between the REF and CLK signals.

The number of memory or storage elements 850 can increase exponentially or as a power of two with the number of bits of resolution of a time difference between the REF and CLK signals. For example, the number of memory elements 850 can increase as $2^{Nbit}$, where Nbit represents the number of bits of time difference resolved. The time resolution of double delay line TDC 800 can equal $\tau_1 - \tau_2$.

Below, table 3 shows a comparison of the single delay line TDC 700, the double delay line TDC 800, and the matrix Vernier TDC 500. Table 3 shows the latency, jitter noise, maximum integral non-linearity (INL), maximum differential non-linearity (DNL), and the number of delay elements for each type of TDC. In Table 3, the lower case letter "n" can represent the number of quantization levels in a digital word of time difference between a reference signal and a clock signal, such as $OUT_{DIV}$. For the matrix TDC 500, "n" can equal the product of the number of elements in delay lines 510 and 520. The coefficient "a" can represent a normalized time delay unit, where Δ can equal the period of a clock signal, $T_{CLK}$, divided by "n". For example, if a first delay line such as first delay line 510, includes N=four delay elements and a second delay line, such as second delay line 520, includes "a"=M=five delay elements, then Δ can equal $T_{CLK}/20$.

TABLE 3

Comparison of TDC Types

| | Single Delay Line TDC 700 | Double Delay Line TDC 800 | Matrix Vernier TDC 500 |
|---|---|---|---|
| Latency | $a \cdot n \cdot \Delta$ | $a \cdot n \cdot \Delta$ | $a\sqrt{n} \cdot \Delta$ |
| Jitter Noise | $\propto a\sqrt{n}$ | $\propto a\sqrt{2 \cdot n}$ | $\propto \cdot a\sqrt{2} \cdot \sqrt{n}\sqrt{}$ |
| Max INL | $a\sqrt{\dfrac{n}{4}} \cdot \sigma$ | $a\sqrt{\dfrac{n}{2}} \cdot \sigma$ | $a\sqrt{\dfrac{\sqrt{n}}{2}} \cdot \sigma$ |
| Max DNL | $a \cdot \sigma$ | $a\sqrt{2} \cdot \sigma$ | $a\sqrt{2} \cdot \sigma$ |
| Number of Delay Elements | n | $2 \cdot n$ | $2 \cdot \sqrt{n}$ |

In Table 3, the symbol a can represent the standard deviation of the quantization noise caused by a TDC. For example, the standard deviation of a uniformly distributed quantization noise can equal $\Delta\phi^2/12$, where $\Delta\phi = 2\pi \times \Delta\tau / T_{CLK}$. Accordingly, σ can equal $\Delta\phi/\sqrt{12}$. Table 3 can be interpreted to show that a matrix Vernier TDC can reduce the latency, jitter, maximum INL, and number of delay elements in comparison with a single or double delay line TDC. The jitter noise of the matrix TDC 500 may increase as a fourth root of the number of delay elements while the jitter noise of the single and double delay line TDCs 700 and 800 may increase as the square root of the number of delay elements. For example, the jitter of a matrix TDC 500 may double when the number of delay elements increases by a factor of 16 while the jitter of the single and single and double delay line TDCs 700 and 800 may double when the number of delay elements quadruples.

Figure 9:
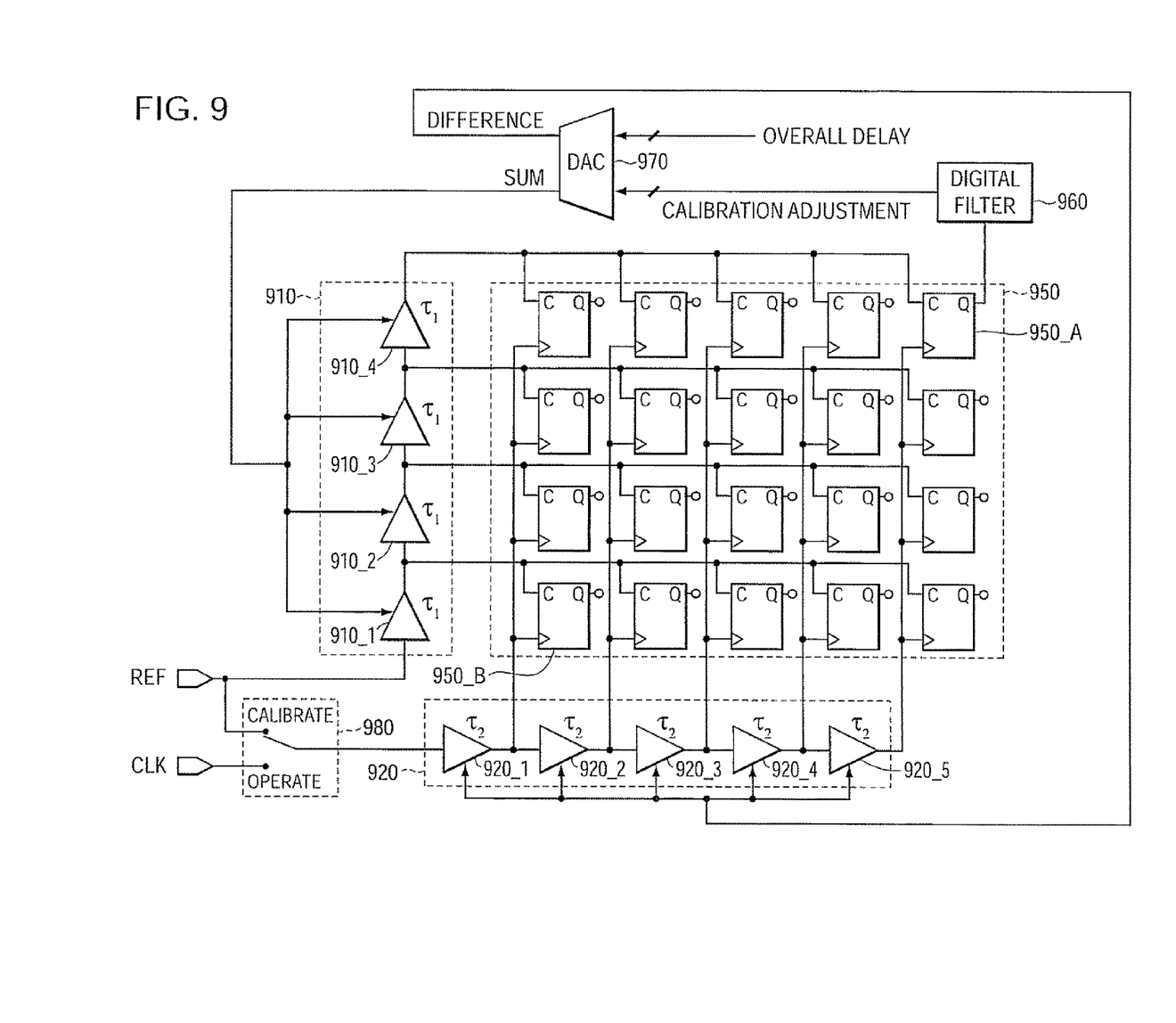
FIG. 9 shows an example of a matrix Vernier TDC.

FIG. 9 shows an example of a matrix Vernier TDC 900 that can include a first delay line 910, a second delay line 920, a matrix memory 950, a digital filter 960, a digital-to-analog converter (DAC) 970, and a calibration switch 980. The first delay line 910 and second delay line 920 can include multiple delay elements 910_1 to 910_4 and 920_1 to 920_5 with substantially equal delays per element for each delay line, $\tau_1$, and $\tau_2$, respectively. The first delay elements 910_1 to 910_4 can feed a delayed reference signal to a subset of the matrix memory 950, such as a corresponding row of matrix memory 950 elements. The second delay elements 920_1 to 920_5 can feed a delayed clock signal to a subset of the matrix memory 950, such as a corresponding column of matrix memory 950 elements. As with TDC 500, the number of normalized delay units in a CLK period can equal integers that are mutually prime or coprime.

The mutually prime or coprime relationship units can allow the matrix TDC 900 to resolve time delay differences to $\Delta\tau$ while maintaining linearity over a dynamic range equal to a CLK period. The first delay line 910 may be described as the reference ingress and the second delay line 920 may be described as the clock signal ingress. The matrix memory 950 may be described as a set of comparators that can store the result of a comparison. For example, matrix memory 950 may include multiple comparators, latches, flip-flops, and the like.

To calibrate the matrix Vernier 900, the storage element 950_A of matrix memory 950 can supply sampled comparisons of pairs of signals from the two delay lines to digital filter 960. Element 950_A can be clocked by the largest delay of the second delay line 920 and can receive the most delayed reference signal from first delay line 910. The SUM output of storage element 950_A may store a ONE or a ZERO state with equal probability when the matrix Vernier 900 is calibrated to capture one CLK period.

The digital filter 960 can integrate, average, or low-pass filter the most delayed reference-to-CLK signal comparison from storage element 950_A and can supply a filtered calibration adjustment to the DAC 970. The DAC 970 can receive an overall delay or common mode word from a controller (not shown), such as the controller 130. The overall delay word can delay the first delay line 910 elements via a SUM signal and can adjust the second delay line 920 via a DIFFERENCE signal. In other words, the DAC 970 can include two or more digital-to-analog converters that output a sum and difference of the overall delay and calibration adjustment words and can supply the SUM and DIFFERENCE signals to the first and second delay lines 910 and 920, respectively.

During calibration, the controller can set the calibration switch 980 to a calibrate position. The calibrate position can supply the reference signal, REF, to both the first delay line 910 and the second delay line 920 simultaneously. The storage element 950_A of matrix memory 950 can supply the clocked, delayed reference signal or bit comparison to the digital filter 960. The feedback calibration configuration of matrix Vernier TDC 900 can balance the delays of each delay line 910-920 so that the matrix of pair-wise bit comparisons stored in matrix memory 950 can be encoded linearly. For example, an encoder (not shown) can accept each stored bit, Q, and can encode a time to digital measurement without missing codes, repeated codes, and the like. The matrix Vernier TDC 900 can exhibit low integral non-linearity (INL) and differential non-linearity (DNL) error when calibrated.

A controller can program the digital filter 960 to control an adjustment convergence rate during calibration. The controller can supply filter coefficients, such as a recursive low-pass filter gain, a leakage parameter, and the like to digital filter 960. When calibration is complete, the controller can switch the calibration switch 980 to the OPERATE position and a clock signal, such as an $OUT_{DIV}$ signal from divider 125, can be supplied to phase lock an ADPLL or synthesize a frequency that is a multiple of the reference signal frequency.

The detailed description of embodiments of the ADPLLs, fractional synthesizers, and ADFLLs disclosed above may use two delay lines. Various alternative embodiments may include more than two delay lines with mutually prime or coprime relationships between the normalized delays of the elements in each delay line. In other words, a matrix TDC, such as matrix TDC 500 or matrix TDC 900 may digitize a time difference between two signals by satisfying multiple simultaneous congruences for each pair of congruence relationships. The Chinese remainder theorem (CRT) may be used to obtain the solutions of multiple simultaneous congruences and so produce highly resolved, linear time to digital conversions. The disclosed ADPLL, frequency synthesizers, and ADFLLs can synthesize, generate, modulate, and track frequencies based on a matrix Vernier TDC that uses two or more delay lines and comparisons of bit pairs or storage of the state of each delay line for each combination of clock and reference signal delays, followed by encoding of the comparisons or stored states to form a digital TDC word.

It may be noted that the connections and roles of the REF and CLK signals may be interchanged and the sign of the TD may be inverted in certain applications. In other words, the TDC 900 can measure a time difference using either sign of the measured time difference. The TDC 900 measurement can be included in a negative feedback loop, such as the feedback loop in an ADPLL, a frequency synthesizer, or an ADFLL with due consideration of the sign of the feedback signal with respect to loop stability.

While the invention has been described in conjunction with the specific exemplary embodiments thereof, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A time to digital converter, comprising:
a reference ingress that receives a reference signal and passes the reference signal through a plurality of first delay elements;
a clock signal ingress that receives a clock signal and passes the clock signal through a plurality of second delay elements; and
a plurality of comparators, coupled to the first and second delay elements, that are configured to receive a plurality of delayed reference and delayed clock signals, each comparator further configured to output a comparison result that indicates the comparison between a pair of delayed reference and delayed clock signals, wherein a total number of the first delay elements plus the second delay elements is less than a number of the plurality of comparators.

2. The time to digital converter of claim 1, wherein each of the first delay elements is coupled to a first subset of the comparators.

3. The time to digital converter of claim 2, wherein each of the second delay elements are coupled to a second subset of the comparators.

4. The time to digital converter of claim 3, wherein the first and second subsets are rows and columns of a matrix comparator array.

5. The time to digital converter of claim 1, wherein the first delay elements are inverters.

6. The time to digital converter of claim 1, wherein the comparators are at least one of latches and flip-flops.

7. The time to digital converter of claim 1, wherein the plurality of comparators output a thermometric code.

8. The time to digital converter of claim 1, wherein the plurality of comparators is further configured to quantize a time difference between the reference and clock signals based on the plurality of comparison results, the time difference including a coherent portion and a jitter portion.

9. The time to digital converter of claim 8, wherein the jitter portion increases as a fourth root of a total number.

10. A method of digitizing a time difference, comprising:
delaying a reference signal in a plurality of first delay elements;
delaying a clock signal in a plurality of second delay elements; and
comparing pairs of delayed reference and delayed clock signals in a plurality of comparators that exceeds a total number of the first delay elements plus the second delay elements.

11. The method of claim 10, further comprising:
inverting the reference signal in each of the first delay elements.

12. The method of claim 10, further comprising:
storing a comparison result for each compared pair of delayed reference and delayed clock signals.

13. The method of claim 10, further comprising:
generating a thermometric code that digitizes a time difference between the reference and clock signals based on a set of outputs from the plurality of comparators.

14. A time to digital converter, comprising:
a first delay line that includes a plurality of first delay elements, the first delay line receiving a reference signal and delays the reference signal by a plurality of first delays;
a second delay line that includes a plurality of second delay elements, the second delay line receiving a clock signal having a clock period and delays the clock signal by a plurality of second delays that are different than the first delays; and
a matrix memory, coupled to the first and second delay lines, that stores a plurality of delayed reference signals at each of a plurality of sampling instants of the delayed clock signals.

15. The time to digital converter of claim 14, wherein a number of first delay elements and a number of second delay elements are coprime.

16. The time to digital converter of claim 15, wherein a total delay of the second delay line substantially equals a total delay of the first delay line.

17. The time to digital converter of claim 16, wherein the first delays are substantially equal.

18. The time to digital converter of claim 17, wherein the second delays are substantially equal and different from the first delays.

19. The time to digital converter of claim 18, wherein the first and second delay elements are at least one of buffer amplifiers and inverters.

20. The time to digital converter of claim 15, wherein a time difference is resolved to an integer number of a delay unit, the delay unit substantially equaling a clock period divided by a multiplicative product of the number of first and second delay elements.

21. The time to digital converter of claim 20, wherein the matrix memory further comprises:
an encoder that is configured to generate an encoded time delay difference with fewer bits than the multiplicative product of the number of first and second delay elements.

22. The time to digital converter of claim 15, wherein the matrix memory further comprises:
a plurality of storage elements that are configured to store the delayed reference signals at the plurality of sampling instants.

23. The time to digital converter of claim 22, wherein the storage elements are arranged in a matrix.

24. The time to digital converter of claim 22, wherein the storage elements are at least one of latches and flip-flops.

25. The time to digital converter of claim 22, wherein a sum of the number of first delay elements and the number of second delay elements is less than the plurality of storage elements.

26. The time to digital converter of claim 25, wherein an encoded time delay difference includes fewer bits than the plurality of storage elements in the matrix memory.

27. A frequency synthesizer, comprising:
a time to digital converter that includes:
a first delay line that includes a plurality of first delay elements, the first delay line receiving a reference signal and delays the reference signal by a plurality of first delays;
a second delay line that includes a plurality of second delay elements, the second delay line that receives a divided clock signal having a divided clock period, the second delay line delaying the divided clock signal by a plurality of second delays different than the first delays, a total delay of the first delay line and a total delay of the second delay line equaling the divided clock period; and
a matrix memory, coupled to the first and second delay lines, that samples a plurality of delayed reference signals at each of a plurality delayed divided clock signals and encodes a time delay difference between the reference signal and the divided clock signal based on the sampled delayed reference signals;
a digital filter that is configured to shape a spectrum of the time delay difference to generate a digital control word;
a digitally controlled oscillator that is configured to generate an oscillatory output signal having an output signal period based on the digital control word;
a divider that is configured to generate the divided clock signal by dividing a frequency of the oscillatory output signal by a multiple; and
a controller that is configured to adjust the multiple based on a predetermined ratio between the clock period and the output signal period.

28. The frequency synthesizer of claim 27, wherein the first and second delay elements are at least one of buffer amplifiers and inverters.

29. The frequency synthesizer of claim 27, wherein the matrix memory further comprises:
an encoder that is configured to generate the encoded time delay difference with fewer bits than a number of first delays elements times a number of second delay elements.

30. The frequency synthesizer of claim 27, wherein the matrix memory further comprises:
a plurality of storage elements that are configured to store the sampled delayed reference signals.

31. The frequency synthesizer of claim 30, wherein the storage elements are arranged in a matrix.

32. The frequency synthesizer of claim 27, wherein a sum of the plurality of first delay elements and the plurality second delay elements is less than a plurality of storage elements.

33. The frequency synthesizer of claim 27, wherein the oscillatory output signal exhibits a at least one of a phase jitter and a maximum integral nonlinearity that increases more slowly than a square root of a sum of the plurality of first delay elements and the plurality of second delay elements.

34. A frequency locked loop, comprising:
an input adder that is configured to subtract a feedback word from a frequency control word to generate a frequency error;
a digital filter that is configured to shape a spectrum of the frequency error to generate a filtered frequency error;

a digitally controlled oscillator that is configured to generate an oscillatory output signal having a frequency that is based on the filtered frequency error;

a time to digital converter that is configured to digitize a time difference between the oscillatory output signal and a reference signal, the time to digital converter including:

a first delay line that includes a plurality of first delay elements, the first delay line receiving a reference signal and delays the reference signal by a plurality of first delays;

a second delay line that includes a plurality of second delay elements, the second delay line that receives a divided clock signal having a divided clock period, the second delay line delaying the divided clock signal by a plurality of second delays different than the first delays, a total delay of the first delay line and a total delay of the second delay line equaling the divided clock period; and a matrix memory, coupled to the first and second delay lines, that samples a plurality of delayed reference signals at each of a plurality delayed divided clock signals and encodes a time delay difference between the reference signal and the divided clock signal based on the sampled delayed reference signals; and a digital differentiator that is configured to generate the feedback word by differentiating the time difference.

35. The frequency locked loop of claim 34, wherein the oscillatory output signal frequency is greater than a reference signal frequency.

36. A method of generating a clock signal, comprising:

delaying a reference signal that has a reference signal period by a plurality of first delays;

delaying the clock signal by a plurality of second delays, to generate a plurality of delayed clock signals, the second delays differing from the first delays such that a total delay of the reference signal and a total delay of the clock signal equals the reference signal period;

storing a plurality of delayed reference signals at each of a plurality of sampling instants of the delayed clock signals; and encoding a digital word that digitizes a time delay difference between the reference signal and the clock signal based on the stored plurality of delayed reference signals.

37. The method of claim 36, further comprising:

filtering the time delay difference to reduce a phase noise of the clock signal; and adjusting a period of the clock signal based on the filtered time delay difference.

\* \* \* \* \*